United States Patent [19]

McCloud

[11] Patent Number: 5,808,567
[45] Date of Patent: Sep. 15, 1998

[54] APPARATUS AND METHOD OF COMMUNICATING USING THREE DIGITS OF A HAND

[75] Inventor: Seth R. McCloud, Seattle, Wash.

[73] Assignee: DSI Datotech Systems, Inc., Vancouver, Canada

[21] Appl. No.: 62,348

[22] Filed: May 17, 1993

[51] Int. Cl.[6] .......................... H03K 17/94; H03M 11/00
[52] U.S. Cl. ............................... 341/20; 341/22; 200/5 A
[58] Field of Search ................................ 341/20, 22, 23, 341/26; 379/368; 200/5 A

[56] References Cited

U.S. PATENT DOCUMENTS 4,042,777  8/1977  Bequaert et al. ........................... 341/22
4,615,629  10/1986  Power ......................................... 341/22

*Primary Examiner*—Thomas D. Lee
*Attorney, Agent, or Firm*—Dean A. Craine

[57] ABSTRACT

An apparatus and method is provided for inputting information to an electronic device using the primary digit and first and second ancillary digits of the operator's hand. In the preferred embodiment, the operator's index finger acts as the primary digit while the middle finger and thumb act as the first and second ancillary digits, respectively. The apparatus includes an interface surface having a selector pad divided into a plurality of selector pad switches. In the preferred embodiment, the nine selector pad switches are arranged on the interface surface according to a 3×3 array for activation by the operator's index finger. Located laterally and below the selector pad are two address switches capable of being selected by the middle finger and thumb of the hand. Using the two address switches, each selector pad switch located in the selector pad may be assigned up to four possible switch addresses. A microprocessor assigns a code element taken from a programmable code table to each address. By using the digits to select the various combinations of switches, the operator is able to input information into an electronic device designed to receive such information. In one embodiment, the code elements are phonemes take from a modified set of IPA phonemes assigned to the code table.

24 Claims, 7 Drawing Sheets

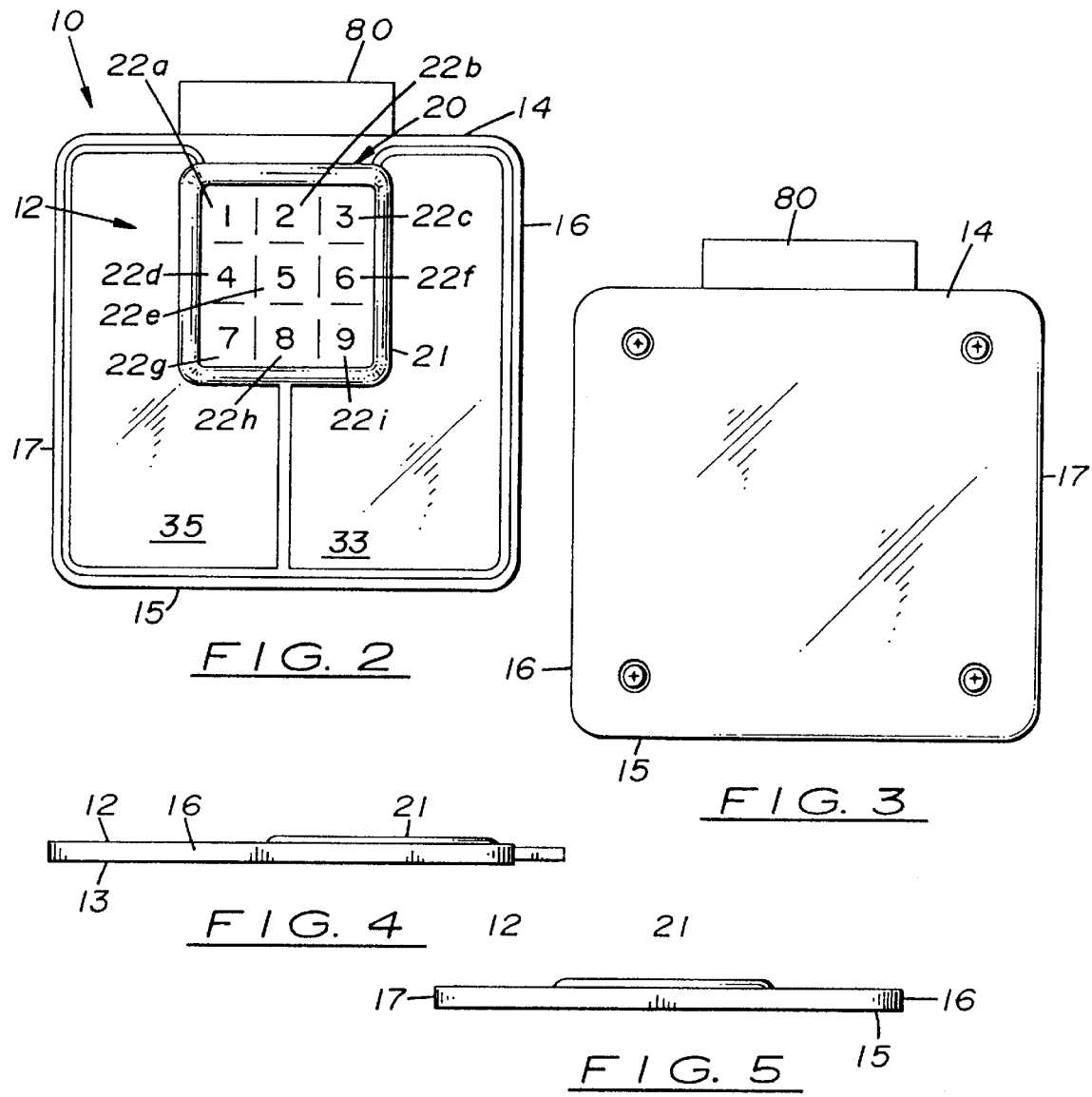

70

| ARRAY I | ARRAY II | ARRAY III | ARRAY IV |
|---|---|---|---|
| 22a/1 22b/2 22c/3<br>22d/4 22e/5 22f/6<br>22g/7 22h/8 22i/9 | 22a/10 22b/11 22c/12<br>22d/13 22e/14 22f/15<br>22g/16 22h/17 22i/18 | 22a/19 22b/20 22c/21<br>22d/22 22e/23 22f/24<br>22g/25 22h/26 22i/27 | 22a/28 22b/29 22c/30<br>22d/31 22e/32 22f/33<br>22g/34 22h/35 22i/36 |
| SELECTOR PAD SWITCH ONLY | SELECTOR PAD & 1st ADD. SWITCHES | SELECTOR PAD & 2d ADD. SWITCHES | SELECTOR PAD, 1st & 2d ADD. SWITCHES |

| ON | OFF | + | | play | rec. | fwd. | | ↑ | ↓ | ← | | red | blue | grn. |
|---|---|---|---|---|---|---|---|---|---|---|---|---|---|---|
| — | VOL↑ | VOL↓ | | rew. | pause | still | | → | A | B | | yel. | blk. | brn. |
| ADJ | VCR | Menu | | stop | time | eject | | Del. | Add | — | | wht. | | |

FIG. 11

APPARATUS AND METHOD OF COMMUNICATING USING THREE DIGITS OF A HAND

BACKGROUND OF THE INVENTION

1. Field of the Invention:

The present invention relates to apparatus and methods for transferring information between a sender and a receiver, and more particularly to an universally adaptable apparatus and method of communicating using three digits of a hand.

2. Description of the Related Art:

Most electronic devices used today, such as computers, have an input component and an output component. Generally, the input components are those elements of the electronic device which are used to enter information into the electronic device for processing. The output components are those components of the electronic device which are used to send the results of processing to a receiver.

Presently, there are over 5 billion people and over 5,000 different languages used in the world. In addition, there are thousands of new electronic devices developed each year, all of which for the most part use different input apparatus and methods. The difficulty in using these electronic devices is compounded by the lack of a common spoken language combined with a lack of a common input apparatus and method.

Most electronic devices are designed to receive specific type of information from a particular type of input device. The electronic device processes the inputted information to accomplish a desired task or output function. For example, a video cassette recorder is designed to process the electrical signals inputted by the operator using the unit's control panel or remote control. A computer, on the otherhand, is designed to process the electrical signals inputted from a keyboard, mouse or pen device, joystick, voice inputting device, or a scanning device operated by the operator.

In order to input information into any electronic device, the operator must understand how to use the input device. This requires that the operator understand two important aspects: first, how to physically use or operate the input device, and; second, how to communicate using the underlying language that the input device is designed to use. Unfortunately today, there is no single apparatus or method for inputting information into all electronic devices that can be used with any language.

A single apparatus and method of communicating that allows an operator into input information to any electronic device in any language, would be very desirable.

SUMMARY OF THE INVENTION

It is an object of the present invention to provide an apparatus capable of being used to input information into a large variety of different electronic devices.

It is another object of the present invention to provide an apparatus used to input information in different languages using one hand.

It is a further object of the present invention to provide a method of communication using three digits of one hand.

The present invention is directed to achieving these objectives by providing an apparatus and method of communication that uses the index finger, thumb, and middle finger of the operator's hand. Using these digits, the operator is able to perform a set of thirty-six relatively simple gestures on the apparatus which may be programmed for inputting information into an electronic device in any language.

Using a primary digit, a first ancillary digit, and a second ancillary digit of one hand, the operator is able to generate one of thirty-six switch addresses using the apparatus. A memory means then assigns a specific code element from a set of communication codes to each address. By manipulating the above digits on the apparatus to generate a desired address, the operator is able to input a series of desired code elements into an electronic device for communicating therewith.

In one embodiment, the apparatus, hereinafter called an input controller, comprises a relatively small, box-shaped structure. The input controller has a planar, top interface surface with a centrally located, square-shaped selector pad. The selector pad contains a plurality of selector pad switches. In the preferred embodiment, there are nine selector pad switches disposed in a 3×3 pattern. The outer edge of the selector pad is raised thereby enabling the operator to tactually distinguish the selector pad from the surrounding areas on the interface surface and to help the operator locate the individual selector pad switches located therein without visual aid.

Two address switches are disposed on the interface surface so that two digits of the same hand may be used to activate them. In the preferred embodiment, the operator's index finger acts as the primary digit, the middle finger acts as the first ancillary digit, and the thumb acts as the second ancillary digit.

The two address switches are located on opposite sides of the interface surface adjacent and below the selector pad for activation by the middle finger and thumb while the index finger simultaneously activates a selector pad switch in the selector pad. The two address switches are designated first and second address switches, respectively. For illustration purposes, the input controller is used by a right-handed operator with the first address switch being located on the right side and the second address switch being located on the left side of the input controller.

The operator uses the input controller by placing one hand over the interface surface. The operator then moves the index finger of the hand to activate one of the nine selector pad switches in the selector pad. As the index finger activates a selector pad switch, the operator simultaneously uses the thumb and middle finger to activate either, both or neither address switches. Each selector pad switch then may be activated alone or in combination with one of three combinations of the first and second address switches to generate one of four possible switch addresses for each selector pad switch. Therefore, by using nine selector pad switches, thirty-six selector pad and address switch combinations may be produced by the digits on the interface surface.

When the operator uses the input controller, switch closure information from the selector pad and address switches is transferred to a gate means electrically connected to the interface surface. The gate means decodes the thirty-six combinations of switch closures into thirty-six unique switch addresses. The first set of switch addresses 1–9 correspond to the combined switch closure information generated when only one selector pad switch is activated without activating one or both address switches. The second set of switch addresses 10–18 correspond to the combined switch closure information generated when a one selector pad switch in the selector pad and the first address switch are simultaneously activated. The third set of switch addresses 19–27 correspond to the combined switch closure information generated when one selector pad switch in the selector pad and the second address switch are simultaneously activated. The fourth set of switch addresses 28–36 correspond to the combined switch closure information generated when one selector pad switch in the selector pad and the first and second address switches are simultaneously activated.

Once the combined switch closure information is decoded by the gate means into an address, it is then transferred by a transferring means to a memory means housed in the preferred embodiment in the electronic device. The memory means associates each address with one communication code element located in a programmable code table. The code table contains a complementary set of communication codes which are used by the electronic device. Each set of communication codes contains up to thirty-six code elements. By associating different sets of communication codes with the code table, the input controller may be used to communicate in different languages.

In one embodiment disclosed herein, the set of communication codes in the code table comprises a modified set of IPA phonemes containing thirty-six phonemes. This modified set of IPA phonemes is identical to the modified set of IPA phonemes described by the inventor, S. McCloud, in U.S. Pat. No. 5,203,704 entitled "METHOD OF COMMUNICATION USING POINTING VECTOR GESTURES AND MNEMONIC DEVICES TO ASSIST IN LEARNING POINTING VECTOR GESTURES".

Using the input controller with a set of communication codes assigned to the code table, a method of communication is provided. In one example, when the set of communication codes comprises the modified set of phonemes described above, the operator inputs a series of different phonemes by touching the appropriate combination of selector pad and address switches to select a desired sequence of phonemes.

To order to communicate using the input controller, the operator must understand how the switch addresses and code elements are associated. To further this understanding, a simple mnemonic device is provided which shows the code table divided into four 3×3 arrays. The first array depicts the switch addresses 1–9 of the nine selector pad switches when activated alone without the address switches. The second array depicts the switch addresses 10–18 of the nine selector pad switches when activated with the first address switch. The third array depicts the switch addresses 19–27 of the nine selector pad switches when activated with the second address switch. The fourth array depicts the switch addresses 28–36 of the nine selector pad switches when activated with both the first and second address switches.

The code elements are then assigned to the switch addresses in a logic manner. With the modified set of IPA phonemes, the thirty-six phonemes code elements are arranged in the four 3×3 arrays to facilitate the rapid and rhythmic inputting of phonetic English words by the operator, as well as promote easy memorization of the location of the phonemes and to improve the understanding of phonetic spelling by desired groupings of phonemes. For example, the first array includes only vowels. The second and third arrays are substantially comprised of unvoiced and voiced fricatives, respectively, and liquids. The fourth array is comprised of the plosives and nasals.

Based on the foregoing summary, a number of salient features are found in the present invention. First, the apparatus is universally adaptable for inputting information into any electronic device. Second, since the code table can be programmed with an infinite number of sets of communication codes each containing up to thirty-six codes, the apparatus may be used to communicate in any language. Third, to use the apparatus and communication method, the operator only needs to learn thirty-six relatively simple gestures using only three fingers of one hand. Fourth, only those relatively strongest fingers of the hand are used. The more versatile index finger is used to activate one of the nine selector pad switches in the selector pad while the thumb and middle finger are simultaneously used to activate one, both or none of the address switches. Using this technique, reduced arm, hand and finger fatigue is achieved as the more tiring finger movements using the ring and little fingers are not required. Relatedly, the operator need not keep track of these two non-used fingers in order to input characters. Consequently, mental fatigue is reduced. Fifth, when the set of communication codes comprises the modified set of IPA phonemes, the individual phonemes are advantageously chosen and arranged to enhance the selection and input operations. The operator of the present invention is able to quickly learn the position in the arrays of each of the phonemes and thereby correlate each of the nine selector pad switches, together with the positions of the thumb and middle finger, with the phonemes. After the locations of the phonemes are known by the operator, phonemes can be inputted in any desired order to a computer or the like. Dictionary look-up tables under software control and provided with the present invention are able to match the phonetic inputs with English words, for example, to be viewed on a viewing screen or monitor and/or pronounced by a speech synthesizer. Consequently, using only the fingers of one hand to activate one of nine selector pad switches and none, one or both address switches on the apparatus, all desired English words can be inputted and displayed or pronounced.

In addition to using the two address switches to generate the thirty-six unique switch addresses with the selector pad switches, they may also be used independently of the selector pad switches to perform other functions, such as turning the input controller on-off or changing the set of communication codes associated with the code table. In another embodiment, the set of communication codes is a set of alpha-numeric codes or elements. In still other embodiments, the set of communication codes could comprise colors, symbols, sounds, or control codes which could be used with computer software programs or a variety of different electronic consumer products.

Additional advantages of the present invention will become readily apparent from the following discussion, when taken together with the accompanying drawings.

BRIEF DESCRIPTION OF THE DRAWINGS

FIG. 2 is a top plan view of the input controller shown in FIG. 1.

FIG. 3 is a bottom plan view of the input controller shown in FIGS. 1–2.

FIG. 4 is a right side elevational view of the input controller shown in FIGS. 1–3.

FIG. 5 is a front elevational view of the input controller shown in FIGS. 1–4.

FIG. 8 is a diagram illustrating the code table with thirty-six switch addresses arranged therein in four 3×3 arrays.

FIG. 11 is an illustration of another embodiment of the code table having machine control characters distributed therein.

DESCRIPTION OF THE PREFERRED EMBODIMENT(S)

Figure 1:
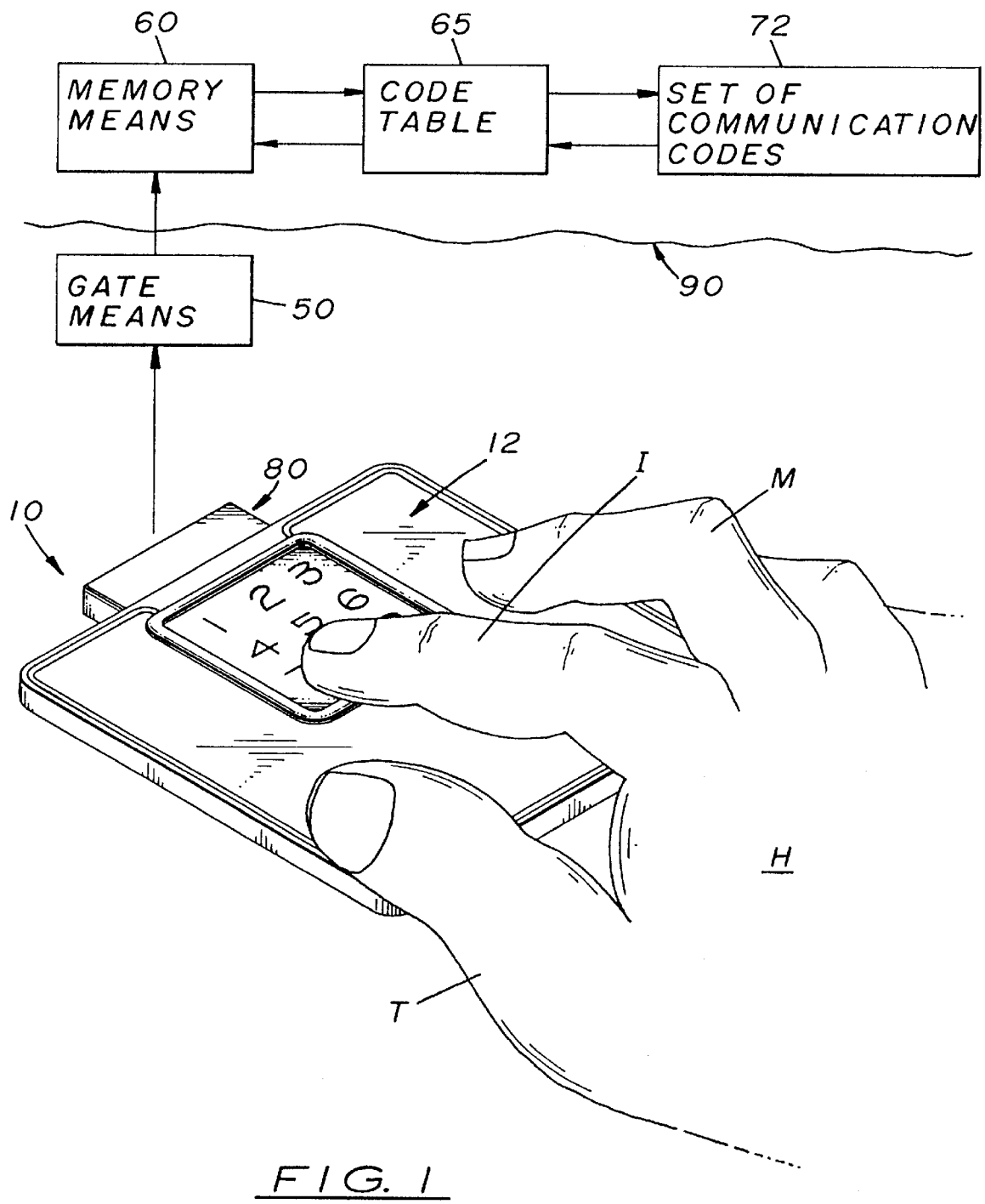
FIG. 1 is a diagrammatic view of the preferred embodiment of the apparatus.

With reference to FIGS. 1–5, an apparatus, hereinafter called an input controller 10, is illustrated for inputting information into an electronic device 90. The input controller 10 is designed for inputting information to an electronic device 90 using the index (I) and middle (M) fingers and thumb (T) of one hand (H) of an operator.

The input controller 10 comprises a box-shaped structure 11 having a planar top interface surface 12, a planar bottom surface 13, planar front and rear surfaces 14, 15 and planar right and left side surfaces 16, 17. Disposed centrally on the interface surface 12 near the edge located between the front surface 14 and the interface surface 12 is a square or rectangular-shaped selector pad 20. The selector pad 20 has a plurality of selector pad switches located therein capable of being selected by a primary digit of the hand. In the preferred embodiment, the selector pad 20 has nine selector pad switches designated 22a–22i which are arranged in a 3×3 manner. In other embodiments, the selector pad 20 could have between one to sixteen selector pad switches 22 located therein.

The interface surface 12 also includes a first address switch 33 and a second address switch 35 located in the vicinity of the selector pad 20 so that they may be operated by other digits of the same hand. In the preferred embodiment, the first and second address switches 33, 35 are located below and on opposite sides of the selector pad 20 so that the operator can activate one selector pad switch 22 in the selector pad 20 using the primary digit of the hand and simultaneously activate neither, either, or both address switches 33, 35 using a first ancillary digit and a second ancillary digit of the hand (H). As shown in FIG. 1, the operator's index finger (I) acts as the primary digit, the middle finger (M) acts as the first ancillary digit, and the thumb (T) acts as the second ancillary digit.

The first address switch 33 is located on the right side of input controller 10 while the second address switch 35 is located on the left side of the input controller 10. With a right-handed operator, the first address switch 33 is controlled with the middle finger (M) while the second address switch 35 is controlled with the thumb (T). With a left-handed operator, the first address switch 33 is controlled with the thumb (T) while the second address switch 35 is controlled with the middle finger (M).

Figure 6:
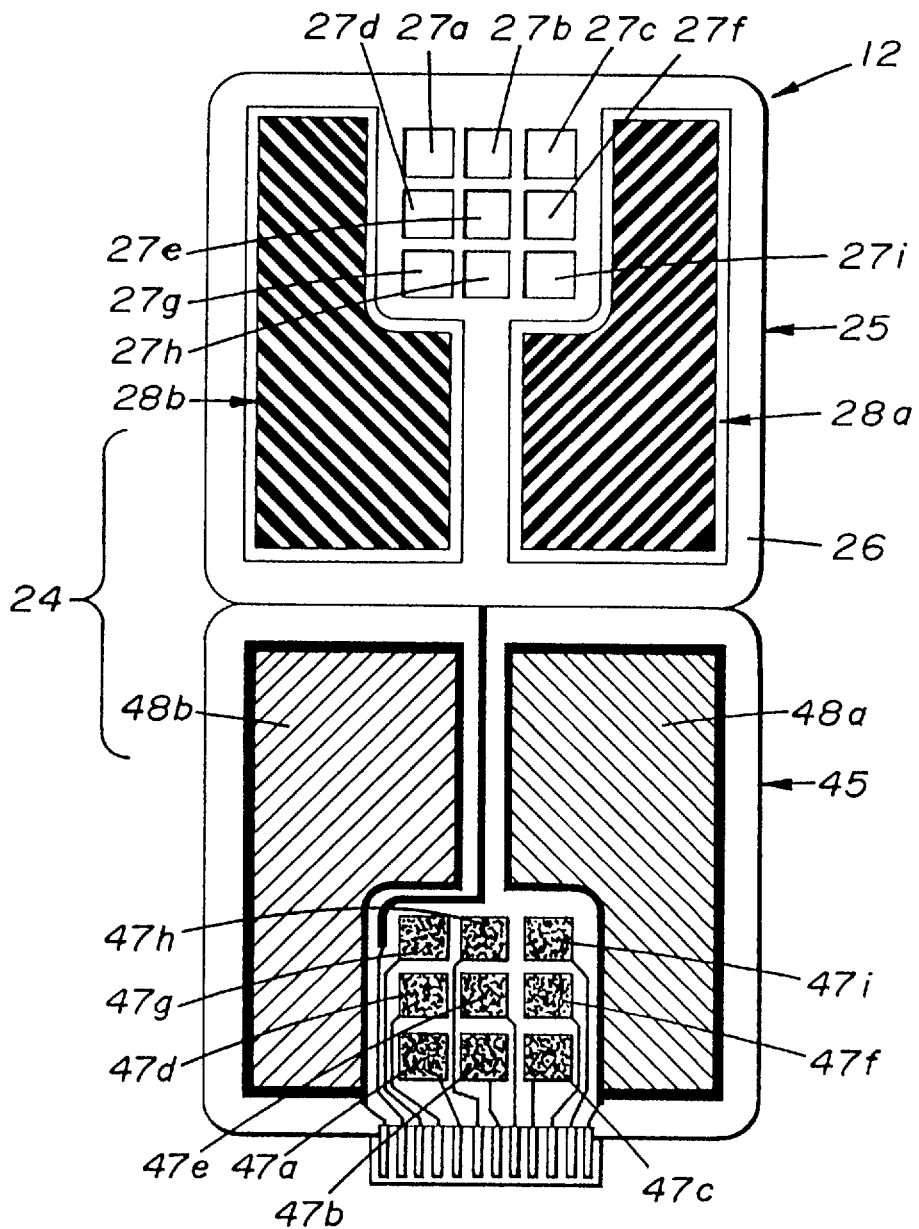
FIG. 6 is a plan view of the touch pad structure in the input controller.

As shown in FIG. 6, the interface surface 12 comprises a membrane touch pad structure 24 having an upper membrane layer 25 and a lower membrane layer 45 separated by dielectric spacer material 55. Formed on the bottom surface 26 of the upper membrane layer 25 are nine selector pad switches connectors 27a–27i and two address switch connectors 28a, 28b. Formed on the top surface 46 of the lower membrane layer 45 are common connector patterns 47a–47i positioned below selector pad switch connectors 27a–27i. Also formed on the top surface 46 are common connector patterns 48a, 48b positioned below the address switch connectors 28a, 28b. When the index finger (I) touches one of the nine selector pad switches 22a–22i in the selector pad 20, the selector pad switch connector 27 located on the bottom surface 26 of the upper membrane layer 25 makes contact with the corresponding common connector pattern 47 located on the top surface 46 of the lower membrane layer 45 which closes the electrical circuit beneath the selector pad switch. When the operator touches the first or second address switch 33, 35, the common connector grid lines 29 located on the bottom surface 26 of the upper membrane layer 25 make contact with the similarly aligned common connector grid lines 47 located on the top surface 46 of the lower membrane layer 45 to close the electrical circuit beneath the address switch.

In the preferred embodiment, the selector pad 20 measures approximately ¾×¾ inches with each selector pad switch 22 measuring approximately ¼×¼ inches. Numerals 1–9 may be printed on the top surface of the selector pad switches 22 for easier reference. As shown in FIG. 2, 4, and 5, located around the selector pad 20 is an outer raised edge 21 which enables the operator to tactually distinguish the selector pad 20 from the surrounding areas on the interface surface 12 and helps the operator to locate the individual selector pad switches 22 in the selector pad 20 without visual aid.

During use, the operator moves the index finger (I) of the hand (H) to activate one of the nine selector pad switches 22a–22i in the selector pad 20. The index finger (I) may be used to activate one selector pad switch 22a–22i only, without the middle finger (M) or thumb (T) touching either the first or second address switches, 33, 35. Alternatively, the index finger (I) may be used to activate one selector pad switch 22a–22i while the middle finger (M) or thumb (T) simultaneously activate either one or both address switches 33, 35. As a result, each selector pad switch 22 has one of four possible address switch combinations associated therewith. Since there are nine selector pad switches 22 total, thirty-six selector pad and address switch combinations may be produced on the interface surface 12.

Figure 7:
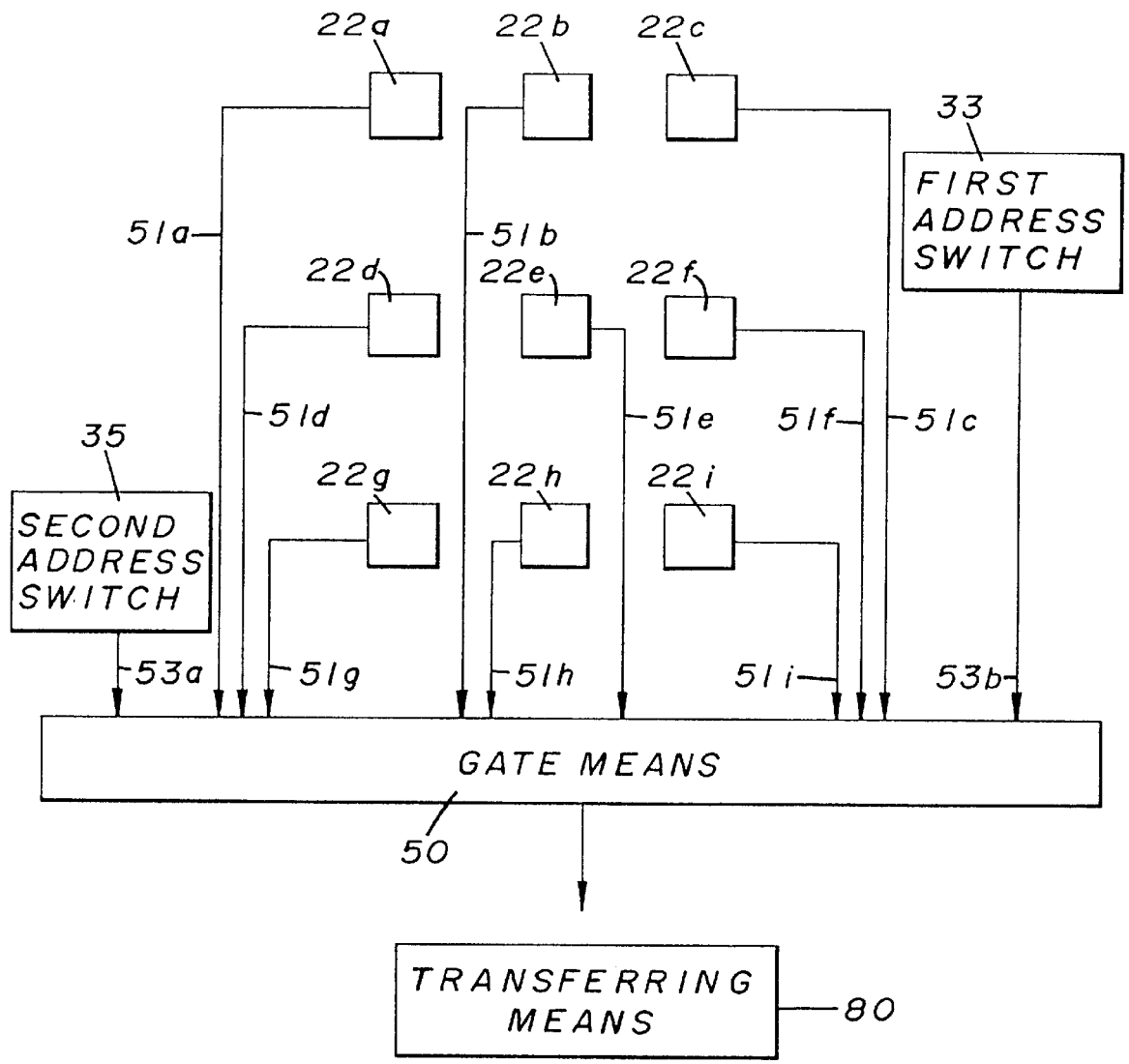
FIG. 7 is a diagram showing the gate means and the electrical connections between the selector pad and address switches.

The input controller 10 also includes a gate means 50 electrically connected to each of the nine selector pad switches 22a–22i and the two address switches 33, 35. In the preferred embodiment, the gate means 50 comprises a logic circuit mounted on a circuit board located inside the input controller 10 beneath the touch pad structure 24. As illustrated in FIG. 7, the gate means 50 has eleven inputs with one selector pad switch input 51a–51i being connected to each of the selector pad switches 22a–22i, respectively, and one address switch input 53a, 53b being connected to each address switch 33, 35. One common line, not shown, is also provided to complete the electrical circuits.

When the operator uses the input controller 10, information regarding the closures of the selector pad 20 and address switches 33, 35 is transferred to the gate means 50. The gate means 50 decodes the thirty-six combinations of switch closures into thirty-six switch addresses. The first set of switch addresses 1–9 correspond to the combined switch closure information generated when only one selector pad switch 22 is activated without activating either address switches 33, 35. The second set of switch addresses 10–18 correspond to the combined switch closure information generated when one selector pad switch 22 in the selector pad 20 and the first address switch 33 are simultaneously activated. The third set of switch addresses 19–27 correspond to the combined switch closure information generated when one selector pad switch 22 in the selector pad 20 and the second address switch 35 are simultaneously activated. The fourth set of switch addresses 28–36 correspond to the combined switch closure information generated when one selector pad switch 22 in the selector pad 20 and the first and second address switches 33, 35 are simultaneously activated.

Once the combined switch closure information is decoded by the gate means 50 into an address, the address is then transferred by a transferring means 80 to a memory means 60. In the preferred embodiment, the transferring means 80 comprises a wireless connector disposed between the input controller 10 and the electronic device 90. The wireless connector can be either an infrared transmitter and receiver or a radio-frequency transmitter and receiver.

In the preferred embodiment, the memory means 60 is housed inside the electronic device 90. It should be understood, however, that the memory means 60 may be housed inside the input controller 10. The memory means 60 comprises a programmable microprocessor capable of associating each address from the gate means 50 with one code element located in a programmable code table 65. The code table 65 contains a complementary set of communication code element which are inputted into the electronic device 90. In each instance, the set of communication codes comprises up to thirty-six code elements. By associating different sets of communication codes with the code table 65, the input controller 10 may be used to communicate in different electronic devices and in different languages.

The specific set of communication codes assigned to the code table 65 depends on the language, the type of electronic device 90, and the type of information being inputted thereto. Typically, the number and type of code elements used in the set of communication codes must be sufficient so that a complete set is provided for communicating between the operator and the electronic device 90.

For clearer understanding of how the switch addresses and code elements are associated, a simple mnemonic device 70 is provided as shown in FIG. 8. The mnemonic device 70, which similates the code table 65, comprises four 3×3 arrays, designated I–IV, with each cell 71 therein assigned one switch address. In one embodiment of the invention, the set of communication codes comprises a modified set of IPA phonemes as defined by SETH R. MCCLOUD, in U.S. Pat. No. 5,203,704. Table 1 shows the modified set of IPA phonemes used herein. Communication takes place between the operator and the electronic device by the operator by manipulating the input controller 10 to input desired sequence of phonemes.

Figure 9:
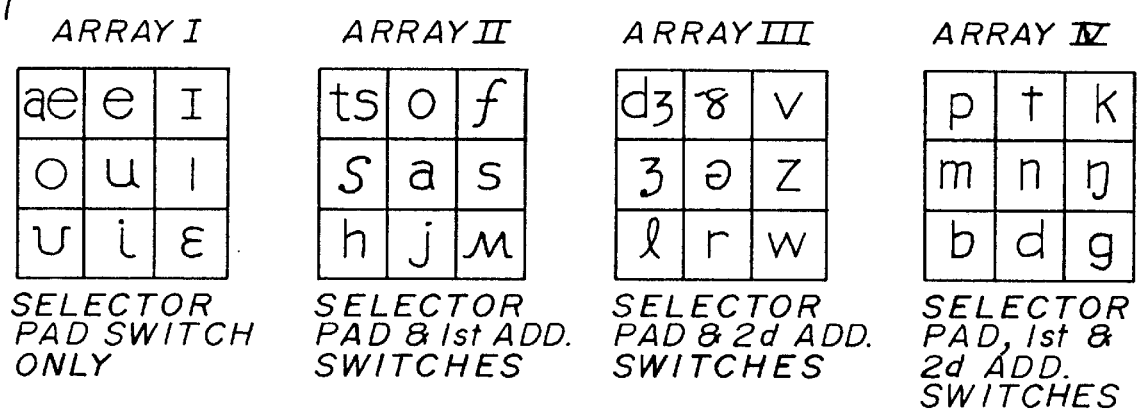
FIG. 9 is an illustration of one embodiment of the code tables showing the placement and distribution of the phoneme code elements using the modified set of IPA phonemes among the four arrays.

In FIG. 9, the mneumonic device 70 is shown with the thirty-six phoneme elements used in the modified set of IPA phonemes 74 divided into the four 3×3 arrays I–IV. By using neither, either, or both the thumb and middle finger of the hand, the operator is able to select which array is associated with the selector pad switches. For example, referring to the array I, the phoneme /æ/ is found in the upper row, left-most column. To input the phoneme /æ/, selector pad switch 22a is touched using the index finger only. To input the other phonemes in array I, only the index finger is used to touch one of the other selector pad switches 22. To input phonemes in array II, the index finger is used to touch one selector pad switch 22 while the middle finger (M) simultaneously touches the first address switch 33. To input phonemes found in array III, the operator touches one of the selector pad switches 22 using the index finger (I) and simultaneously touches the second address switch 35 using the thumb (T). Lastly, to activate phonemes from array IV, the operator touches one of the selector pad switches 22 using the index finger (I) and simultaneously touches the first address switch 33 using the middle finger (M) and simultaneously touches the second address switch 35 using the thumb (T).

With regard to the first mnemonic device 70 shown in FIG. 9, the modified set of IPA phonemes 74 where assigned to the switch addresses 1–36 according to certain characteristics. For example, array I includes only vowels. Arrays II–III are substantially comprised of unvoiced and voiced fricatives, respectively, and the liquids. Array IV is comprised of the plosives and nasals. The chosen phonemes identify common spoken phonemes, however some relatively common phonemes are not included in order to maintain a set of phonemes limited to thirty-six in the four array configuration. Specifically, the phoneme /oI/ (as in "coin" and "boy") is not included but can be provided or selected by using a combination of the phonemes /o/ and /I/. Similarly, the phoneme /au/ (as in "now" and "loud") is not provided but can be formed or selected by using a combination of the phonemes /Θ/ and /o/. Additionally, the phoneme /a/ (as in "father", "car", and "heart") is not provided, but it has been noted that this phoneme essentially corresponds to the /a/ phoneme, which is provided in array 3.

To further describe the operation of the input controller 10 illustrated in FIGS. 1–5, the following example is provided. Assuming that the operator wishes to input the English word "stove," into an electronic device 90, the sequence of operation includes the following events. First, the operator inputs the phoneme /s/ by engaging or touching the first address switch 33 using the middle finger (M) in order to associate the phonemes in the array II with the selector pad switches 22a–22i. Simultaneously with the movement of the middle finger (M), the operator touches the selector pad switch 22f to select the phoneme /s/ in array II shown in FIG. 9. The operator then moves the index finger (I) towards selector pad switch 22b. While the index finger (I) is moving, the operator uses the middle finger (M) to engage the first address switch 33 and the thumb (T) to engage the second address switch 35 so that, at the time the index finger (I) reaches the selector pad switch 22b, the switch addresses 28–36 are associated with the selector pad switches 22a–22i. Consequently, the touching of the selector pad switch 22b, the phoneme /t/ is selected from the code table 65. After this, the operator moves the index finger (I) towards the selector pad switch 22d while removing the thumb (T) and middle finger (M) from the first and second address switches 33, 35. Because the selector pad switches 22, when used without the address switches 33, 35, are associated with code elements found in array I, the operator causes the selection of the phoneme /o/ from the code table 65. Lastly, the operator moves the index finger (I) towards selector pad switch 22c. As before, while the index finger (I) is in transit between two of the selector pad switches 22d and 22c, the operator engages the second address switch 35 using the thumb (T) so that, when the index finger (I) reaches selector pad switch 22c, it associates with the phoneme /v/ found in array III. This contacting or engagement of selector pad switch 22c by the index finger (I) causes the phoneme /v/ to be selected from the code table 65. Because the letter "E" is not pronounced in the word "stove," the phonetic input is complete. In one embodiment, the completion of the phoneme input may be indicated by removal of all of the three digits from the interface surface 12. If the electronic device 90 is a computer, it may have a look-up table to correlate the English word "stove" with its inputted phonetic equivalent "stov".

In connection with the operation of the foregoing embodiment, it should be appreciated that the operator can determine the position of the index finger (I) relative to the selector pad switches 22 by the direction and/or distance previously taken by the index finger (I) and by determining whether the index finger (I) is touching the outer raised edge 21. In this manner, the operator need not observe or look at the interface surface 12 during the inputting operation. For example, in moving from selector pad switch 22f to selector pad switch 22b, the operator can determine that the index finger (I) is located in the selector pad switch 22f, defined as the center row and right-most column of the selector pad 20, by feeling the right vertical side member of the raised outer edge 21 against the index finger (I). When the operator moves the index finger (I) to selector pad switch 22b, the operator feels the horizontal top member of the raised outer edge 21. Furthermore, to achieve success in the using the input controller 10, the operator becomes familiar with the different digit movements that are required to input the thirty-six phonemes and also learns to rapidly and efficiently input any sequence of desired phonemes by continuous movement of the three digits in the manner that results in the desired inputting.

In other embodiment, the order and sequence of activating the first and second address switches 33, 35 without the index finger (I) touching a selector pad switch 22, can be used to change the set of communication codes associated with the code table 65. For example, if the first address switch 33 is double tapped, the set of communication codes associated to the code table 65 could be changed from the modified set of IPA phonemes 74 discussed above, to a set of alpha-numeric code elements 76 containing the twenty-six letters of the English alphabet and the numbers 1–9 as shown in FIG. 9.

Figure 10:
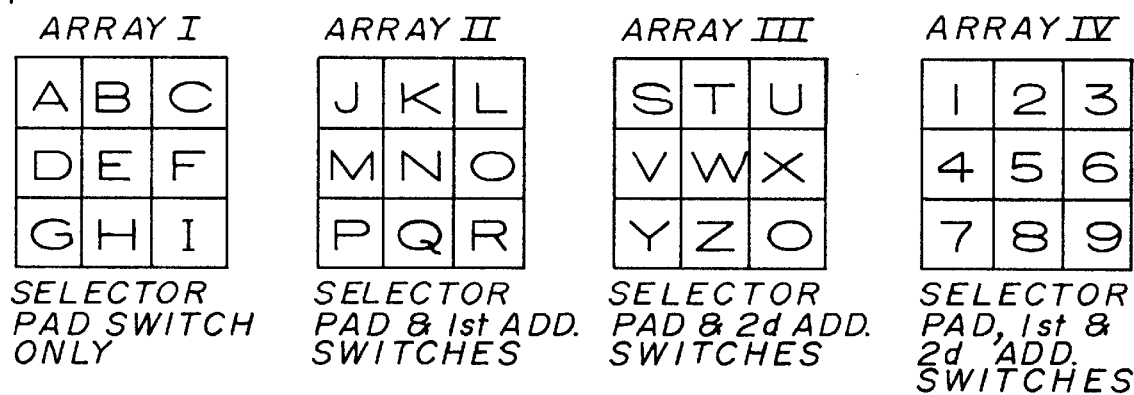
FIG. 10 is an illustration of another embodiment of the code table having alpha-numeric characters distributed therein.
Figure 12:
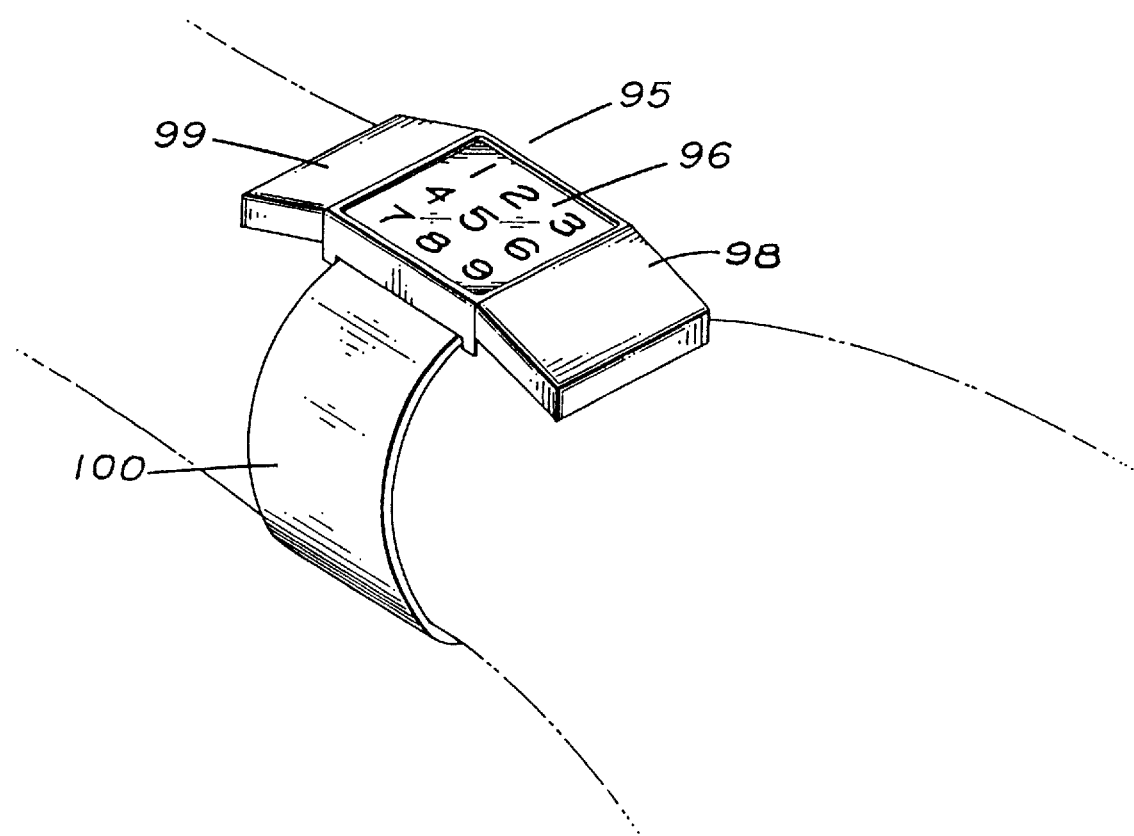
FIG. 12 is an illustration of the input controller having a wrist band configuration.

It should also be understood that the set of communication codes assigned to the code table 65 need not be a character. For example, when used with an suitable computer software, various cursor commands and colors could be assigned to the code table. When used to control home entertainment equipment, such as TV, VCR, music receiving and playback equipment, the code table could have appropriate machine control codes, such as on-off, play, fast forward, rewind, pause, still, record, volume control, etc., assigned thereto as shown in FIG. 10.

It should be understood, that the above input controller 10 can be incorporated in other physical structures. For example, FIG. 11 shows a wrist band structure 95 having an interface surface 96 comprising a planar selector pad 97 and two adjacently located first and second address switches 98, 99, respectively. The first and second address switches 98, 99 are aligned perpendicular to the longitudinal axis of the user's arm.

Even though the operation of the embodiments has been described in terms of selecting a selector pad and address switches in order to input code elements, the invention contemplates that digit contact pressure could be used in selecting or enhancing desired characters. The switches themselves could be software defined areas on a touch sensitive pad.

It should also be understood that, although the preferred embodiment of the present invention is described in terms of phonetic characters formatted in four different arrays, other information or characters selected for input can be utilized. That is, the information need not be phonetic characters and the information need not be defined or stored in memory in a number of arrays, each array having the same number of characters.

In view of the foregoing description, a number of advantages of the present invention are easily recognized. A one-handed input controller 10 is provided for inputting information to a number of possible electronic devices, including a computer or the like. Consequently, the other hand of the operator is not dedicated to the input operation and can be used for other tasks. The unique inputting technique reduces fatigue associated with manipulation of an operator's hand and fingers. Furthermore, the operator need not observe the interface surface 12 of the input controller 10 while inputting desired information and, relatedly, can use the present invention in an environment that does not permit him to see the input controller 10. Also, the operator is able to observe other events while using the input device. The present invention is further characterized by having a minimal number of selector pad switches 22 that reduce the space occupied by the device, reduce the number of selector pad switches 22 that are to be accessed and, concomitantly, reduces the number of codes including phonemes that must be remembered, as well as reducing the amount of finger movement. The present invention also incorporates a preferred selection and arrangement of phonemes that facilitate memorization of the phonemes and their location for inputting thereof. Finally, differently constructed mechanisms can be employed to utilize the three digit input method.

Using above input controller and a set of communication codes assigned to the code table, a method of communicating using three digits of a hand is provided. The method of communicating by an operator to electronic device 90 using only three digits of a hand, comprises the following steps:

a. providing an input controller having nine selector pad switches arranged in a 3×3 array, said input controller also including first and second address switches located in the vicinity of said selector pad switches;

b. associating one code element from a set of communication codes with each combination of said selector pad switches and said first and second address switch;

c. touching one said selector pad switch using the index finger of said hand of said operator and touching one, both, or none of said first and said second address switches using the middle finger and thumb of said hand to input a desired code element into said electronic device;

d. transferring information regarding said combination of said selector pad switch and said first and second address switch to said electronic device, and;

e. repeating steps (c) and (d) until all of said desired code elements are transferred to said electronic device.

In compliance with the statute, the invention has been described in language more or less specific as to structural features. It should be understood, however, that the invention is not limited to the specific features shown since the means and construction shown comprises the preferred forms of putting the invention into effect. The invention is, therefore, claimed in any of its forms or modifications within the legitimate and valid scope of the amended claims, appropriately interpreted in accordance with the doctrine of equivalents.

I claim:

1. An apparatus for inputting information into an electronic device using three digits of a hand, comprising;
    a. a selector pad having a plurality of selector pad switches capable of being selected by the index finger of said hand;
    b. a first address switch located in the vicinity of said selector pad capable of being activated by a first ancillary digit located immediately adjacent to said index finger while one said selector pad switch is being simultaneously selected by said index finger;
    c. a second address switch located in the vicinity of said selector pad capable of being activated by a second ancillary digit located immediately adjacent to said index finger while one said selector pad switch is being selected by said index finger and said first address switch is being simultaneously selected by said first ancillary digit;
    d. a gate means capable of decoding the combined switch closure information of said selector pad switches and said first and second address switches into an unique switch address;
    e. a transferring means capable of transmitting said switch address to an electronic device capable of using said information, and;
    f. a memory means capable of associating said signal address transferred from said apparatus with one code taken from a set of communication codes capable of being used to communicate between said apparatus and the electronic device.

2. An apparatus, as recited in claim 1, wherein said selector pad has nine selector pad switches arranged according to a 3×3 array.

3. An apparatus, as claimed in claim 2, wherein said selector pad and said first and second address switches are disposed on an interface surface.

4. An apparatus, as claimed in claim 3, wherein said first and second address switches are disposed on opposite sides of said interface surface adjacent to and below said selector pad to enable an operator to simultaneously select said selector pad switches in said selector pad using said primary digit and said first and second address switches using said first ancillary digit and said second ancillary digit, respectively.

5. An apparatus, as claimed in claim 4, wherein said primary digit finger is the index finger, said first ancillary digit is the middle finger, and the second ancillary digit is the thumb of said hand.

6. An apparatus, as claimed in claim 1, wherein said selector pad has a raised outer edge thereby enabling the user to tactually distinguish said selector pad on said apparatus.

7. An apparatus for inputting information to an electronic device, comprising:
    a. a selector pad having nine selector pad switches arranged according to a 3×3 array;
    b. a first address switch in the vicinity of said selector pad so that an user may simultaneously select said first address switch and any one said selector pad switch on said selector pad using one hand;
    c. a second address switch in the vicinity of said selector pad switches in said selector pad so that an user may simultaneously select said second address switch and any one said selector pad switch on said selector pad and simultaneously select said first address switch using one said hand;
    d. a gate means capable of decoding switch closure information of said selector pad switches and said first and second address switches into a plurality of switch addresses;
    e. a transferring means capable of transmitting said signal addresses from said gate means to an electronic device capable of using said information, and;
    f. a memory means connected to said electronic device, said memory means being capable of associating said signal address produced by said apparatus with one code taken from a set of communication codes capable of being used to communicate between said apparatus and said electronic device.

8. An apparatus, as claimed in claim 7, wherein said selector pad and said first and second address switches are disposed on a planar interface surface.

9. An apparatus, as claimed in claim 8, wherein said first and second address switches are disposed on opposite sides of said interface surface adjacent to and below said selector pad to enable an operator to select said selector pad switches in said selector pad using the index finger and to select said first and second address switches using the thumb and middle finger of one hand.

10. An apparatus, as claimed in claim 9, wherein said selector pad has a raised outer edge thereby enabling the user to tactually distinguish said selector pad from the surrounding areas on said interface surface.

11. An apparatus, as claimed in claim 9, wherein said transferring means includes a cable connector electrically connected between said interface surface and said electronic device.

12. An apparatus, as claimed in claim 9, wherein said transferring means includes a wireless transmitter and receiving units disposed between said interface surface and said electronic device.

13. An apparatus, as claimed in claim 9, further including a memory means disposed between said interface surface and said electronic device capable of assigning a code element from a set of communication codes to each said address.

14. An apparatus, as claimed in claim 13, wherein said set of communication codes include thirty-six phonemes.

15. An apparatus, as claimed in claim 14, wherein said set of thirty-six phonemes are taken from a modified set of IPA phonemes including the following phonemes: /b/, /d/, /f/, /g/, /h/, /k/, /l/, /m/, /n/, /p/, /r/, /s/, /ti, /v/, /w/, /z/, /j/, / ʙ /, / ʃ /, / ʒ /, / ʧ /, / ʤ /, / ʍ /, / θ /, / ʂ /, /i/, /I/, /e/, /ɛ/, /æ/, /a/, /o/, /U/, /u/, /ə/, and /aI/.

16. An apparatus, as claimed in claim 14, wherein said code elements in said set of communication codes includes alpha-numeric characters.

17. An apparatus, as claimed in claim 14, wherein said code elements in said set of communication codes includes machine control characters.

18. A method of communicating by an operator with an electronic device using only three digits of a hand, comprising:
    a. providing an input controller having nine selector pad switches arranged in a 3×3 array, said input controller also including first and second address switches located in the vicinity of said selector pad switches;
    b. associating one code element from a set of communication codes with each combination of said selector pad switches and said first and second address switch;
    c. touching one said selector pad switch using the index finger of said hand of said operator and touching either, both, or neither of said first and said second address switches using the middle finger and thumb of said hand to input a desired code element into said electronic device;

d. transferring information regarding said combination of said selector pad switch and said first and second address switch to said electronic device, and;

e. repeating steps (c) and (d) until all of said desired code elements are transferred to said electronic device.

19. A method of communicating, as claimed in claim 18, wherein said set of communication codes include thirty-six phonemes.

20. A method of communicating, as claimed in claim 19, wherein said set of thirty-six phonemes are taken from a modified set of IPA phonemes including the following: /b/, /d/, /f/, /g/, /h/, /k/, /l/, /m/, /n/, /p/, /r/, /s/, /ti, /v/, /w/, /z/, /j/, / ɒ /, / ʃ /, / ʒ /, / ʧ /, / ʤ /, / ʍ /, / θ /, / ʂ /, /i/, /I/, /e/, /ɛ/, /œ/, /a/, /o/, /U/, /u/, /ə/, and /Ai/.

21. A method of communicating, as claimed in claim 20, wherein said phonemes are arranged in four arrays with a first array including vowels, second and third arrays including fricatives, and a fourth array including plosives.

22. A method of communicating, as claimed in claim 18, wherein said set of communication codes comprises a set of alpha-numeric codes all of the letters in the English alphabet and the numbers 0 to 9.

23. A method of communicating, as claimed in claim 18, wherein said step of providing input means includes positioning said first and said second address switches at a distance relative to said index finger in order to permit touching of said first and said second address switch using said middle finger and said thumb with minimal extension or retraction of said middle finger and said thumb from the normal position of the middle finger and said thumb relative to said index finger during movement of said index finger between said selector pad switches.

24. A method of communicating, as claimed in claim 18, wherein said code elements in said set of communication codes includes machine control characters.

* * * * *